United States Patent
Li et al.

(10) Patent No.: US 11,873,555 B2
(45) Date of Patent: Jan. 16, 2024

(54) VAPORIZER, SUBSTRATE PROCESSING APPARATUS AND METHOD OF MANUFACTURING SEMICONDUCTOR DEVICE

(71) Applicant: Kokusai Electric Corporation, Tokyo (JP)

(72) Inventors: Gen Li, Toyama (JP); Hirohisa Yamazaki, Toyama (JP); Kenichi Suzaki, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

(21) Appl. No.: 17/204,210

(22) Filed: Mar. 17, 2021

(65) Prior Publication Data

US 2021/0292895 A1    Sep. 23, 2021

(30) Foreign Application Priority Data

Mar. 19, 2020 (JP) .................. 2020-048652

(51) Int. Cl.
  *C23C 16/44* (2006.01)
  *H01L 21/67* (2006.01)
(52) U.S. Cl.
  CPC .... *C23C 16/4405* (2013.01); *H01L 21/67017* (2013.01)
(58) Field of Classification Search
  CPC .................................................. C23C 16/4405
  See application file for complete search history.

(56) References Cited

U.S. PATENT DOCUMENTS

| 2003/0159811 A1 | 8/2003 | Nurmi |
| 2010/0186774 A1 | 7/2010 | Miya et al. |
| 2010/0230834 A1 | 9/2010 | Sakata et al. |
| 2012/0011943 A1 | 1/2012 | Oba et al. |

FOREIGN PATENT DOCUMENTS

| CN | 102348832 A | 2/2012 |
| JP | 05-002701 U | 1/1993 |
| JP | 2004-211183 A | 7/2004 |

(Continued)

OTHER PUBLICATIONS

Intellectual Property Office of Singapore Office Action dated Dec. 28, 2021 for Singapore Patent Application No. 10202102647S.

(Continued)

*Primary Examiner* — Jason Y Ko
(74) *Attorney, Agent, or Firm* — Volpe Koenig

(57) ABSTRACT

Described herein is a technique capable of stabilizing a supply flow rate of a vaporized gas. According to one aspect of the technique, there is provided a vaporizer including: a liquid vessel in which a liquid source is stored; a first heater capable of heating the liquid source by immersion into the liquid source stored in the liquid vessel; a second heater capable of heating the liquid vessel; a first temperature sensor capable of measuring a temperature of the liquid source by immersion into the liquid source; a second temperature sensor capable of measuring a temperature of the liquid vessel; and a controller capable of controlling the first heater based on the temperature measured by the first temperature sensor and controlling the second heater based on the temperature measured by the second temperature sensor.

15 Claims, 6 Drawing Sheets

(56) References Cited

FOREIGN PATENT DOCUMENTS

| | | | |
|---|---|---|---|
| JP | 2004-323894 | A | 11/2004 |
| KR | 10-2015-0141252 | A | 12/2015 |
| TW | 200302810 | A | 8/2003 |
| TW | 201040306 | A | 11/2010 |
| WO | 2009-037990 | A1 | 3/2009 |
| WO | 2019/180906 | A1 | 9/2019 |

OTHER PUBLICATIONS

Taiwan Office Action dated Dec. 21, 2021 for Taiwan Patent Application No. 110106232.
Korean Office Action dated Jan. 20, 2023 for Korean Patent Application No. 10-2021-0033302.
ISA State Intellectual Property Office of the People's Republic of China, Office Action of the International Searching Authority dated Jul. 26, 2023 for Chinese Patent Application No. 202110294265.7.

VAPORIZER, SUBSTRATE PROCESSING APPARATUS AND METHOD OF MANUFACTURING SEMICONDUCTOR DEVICE

CROSS-REFERENCE TO RELATED PATENT APPLICATION

This non-provisional U.S. patent application claims priority under 35 U.S.C. § 119 of Japanese Patent Application No. 2020-048652, filed on Mar. 19, 2020, in the Japanese Patent Office, the entire contents of which are hereby incorporated by reference.

BACKGROUND

1. Field

The present disclosure relates to a vaporizer, a substrate processing apparatus and a method of manufacturing a semiconductor device.

2. Related Art

In recent years, as a semiconductor device is miniaturized and a density of the semiconductor device increases, a high dielectric constant (high-k) oxide film may be preferably used as a gate insulating film. In addition, in order to increase a capacity of a DRAM capacitor, the high dielectric constant oxide film may be applied to a capacitor insulating film. Preferably, the high dielectric constant oxide film is formed at a low temperature using a film-forming method with less foreign substances such that characteristics of the film such as a surface flatness, a recess filling property and a step coverage property are excellent. Regarding the control of the foreign substances, a method of removing the film deposited on an inner wall of a reaction tube (that is, a process chamber) by a gas cleaning process are performed in general without disassembling the reaction tube.

When performing a process such as a gas cleaning process and a film-forming process, a gas (also referred to as a "vaporized gas") obtained by vaporizing a liquid source by heating a vessel in which the liquid source is stored may be used. In such a case, when a supply of the gas into the reaction tube is started by opening a supply valve, a vaporization amount of the gas increases and the vaporization heat is transferred to the liquid source. Thereby, a temperature of the liquid source is lowered. As a result, the vaporization amount decreases. That is, when the supply of the gas is started, the temperature of the liquid source is lowered by the vaporization heat, and the vaporization amount of the gas may fluctuate. As a result, it may not be possible to stably supply the gas into the reaction tube.

SUMMARY

Described herein is a technique capable of stabilizing a supply flow rate of a vaporized gas.

According to one aspect of the technique of the present disclosure, there is provided a vaporizer including: a liquid vessel in which a liquid source is stored; a first heater capable of heating the liquid source by immersion into the liquid source stored in the liquid vessel; a second heater capable of heating the liquid vessel; a first temperature sensor capable of measuring a temperature of the liquid source by immersion into the liquid source; a second temperature sensor capable of measuring a temperature of the liquid vessel; and a controller capable of controlling the first heater based on the temperature measured by the first temperature sensor and controlling the second heater based on the temperature measured by the second temperature sensor.

DETAILED DESCRIPTION

Embodiments

Figure 1:
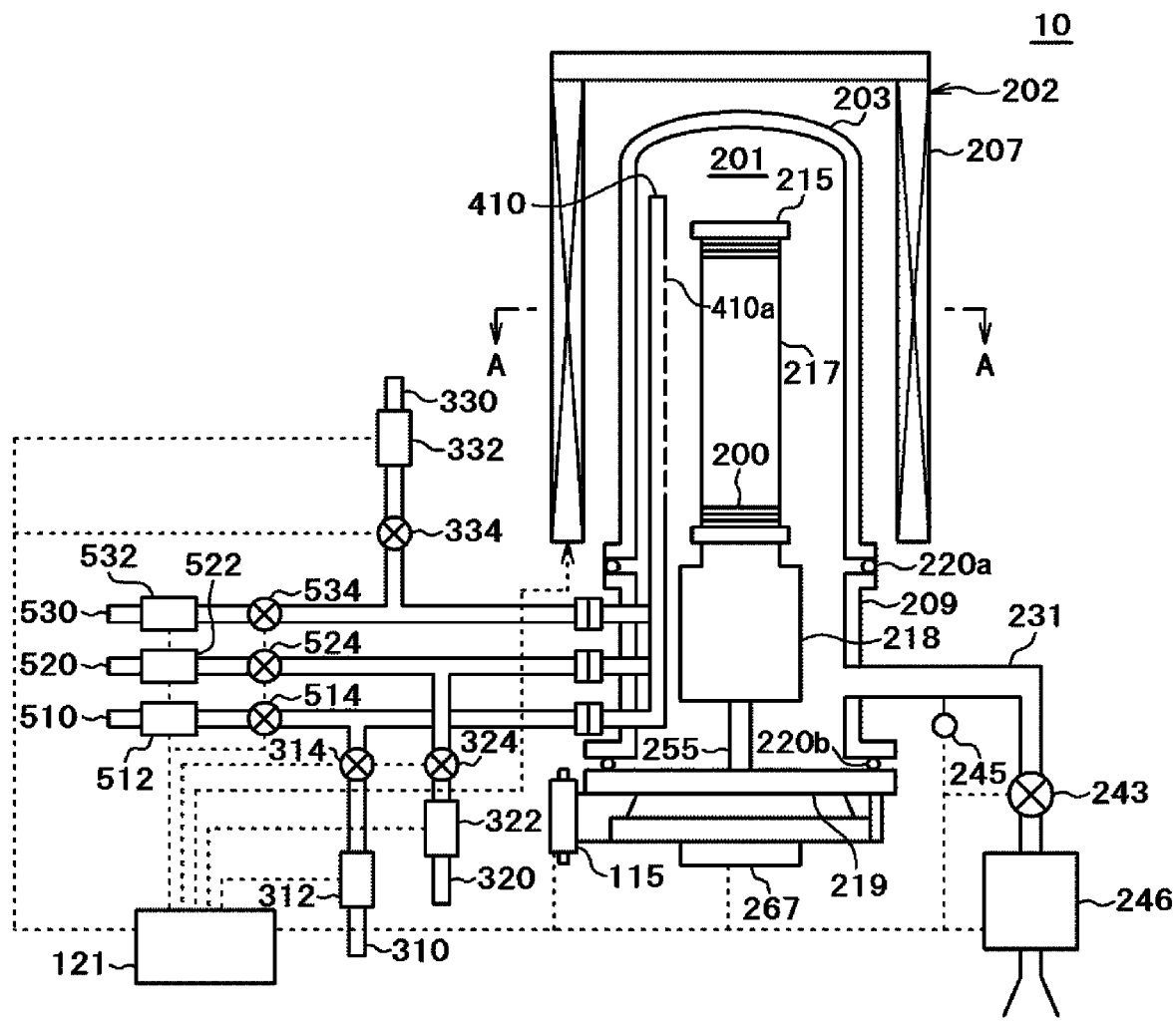
FIG. 1 schematically illustrates a vertical cross-section of a vertical type process furnace of a substrate processing apparatus preferably used in one or more embodiment described herein.

Hereinafter, one or more embodiments (also simply referred to as "embodiments") according to the technique of the present disclosure will be described with reference to FIGS. 1 through 6.

(1) Configuration of Process Furnace

A substrate processing apparatus 10 according to the present embodiments includes a process furnace 202. The process furnace 202 includes a heater 207 serving as a heating apparatus (which is a heating structure or a heating system). The heater 207 is of a cylindrical shape, and is vertically installed while being supported by a heater base (not shown).

A reaction tube 203 constituting a reaction vessel (also referred to as a "process vessel") is provided at an inner side of the heater 207 to be aligned in a manner concentric with the heater 207. For example, the reaction tube 203 is made of a heat resistant material such as quartz ($SiO_2$) and silicon carbide (SiC). The reaction tube 203 is of a cylindrical shape with a closed upper end and an open lower end. A manifold (which is an inlet flange) 209 is provided under the reaction tube 203 to be aligned in a manner concentric with the reaction tube 203. The manifold 209 is made of a metal such as stainless steel (SUS). The manifold 209 is of a cylindrical shape with open upper and lower ends. An O-ring 220a serving as a seal is provided between the upper end of the manifold 209 and the reaction tube 203. As the manifold 209 is supported by the heater base (not shown), the reaction tube 203 is installed vertically. A process chamber 201 in which a substrate is processed is provided in a hollow cylindrical portion of the process vessel.

The process chamber 201 is configured to accommodate a plurality of wafers including a wafer 200 serving as the substrate vertically arranged in a horizontal orientation in a multistage manner a boat 217 described later. Hereinafter, the plurality of the wafers including the wafer 200 may also be simply referred to as wafers 200.

Nozzles 410, 420 and 430 are provided in the process chamber 201 so as to penetrate a side wall of the manifold 209. Gas supply pipes 310, 320 and 330 are connected to the nozzles 410, 420 and 430, respectively.

Mass flow controllers (MFCs) 312, 322 and 332 serving as flow rate controllers (flow rate control structures) and valves 314, 324 and 334 serving as opening/closing valves are sequentially installed at the gas supply pipes 310, 320 and 330, respectively, from upstream sides to downstream sides of the gas supply pipes 310, 320 and 330. Gas supply pipes 510, 520 and 530 configured to supply an inert gas are connected to the gas supply pipes 310, 320 and 330 at downstream sides of the valves 314, 324 and 334 of the gas supply pipes 310, 320 and 330, respectively. MFCs 512, 522 and 532 and valves 514, 524 and 534 are sequentially installed at the gas supply pipes 510, 520 and 530, respectively, from upstream sides to downstream sides of the gas supply pipes 510, 520 and 530.

Each of the nozzles 410, 420 and 430 is configured as an L-shaped nozzle. A horizontal portion of each of the nozzles 410, 420 and 430 is installed so as to penetrate the side wall of the manifold 209. A vertical portion of each of the nozzles 410, 420 and 430 is installed in an annular space provided between an inner wall of the reaction tube 203 and the wafers 200, and extends upward along the inner wall of the reaction tube 203 (that is, extends upward along a wafer arrangement direction). That is, the vertical portion of each of the nozzles 410, 420 and 430 extends upward from one end toward the other end of a wafer arrangement region in which the wafers 200 are arranged (stacked). Specifically, the nozzles 410, 420 and 430 are installed in a region that horizontally surrounds the wafer arrangement region along the wafer arrangement direction.

A plurality of gas supply ports 410a, a plurality of gas supply ports 420a and a plurality of gas supply ports 430a facing the plurality of the wafers including the wafer 200, through which a gas such as a source gas, a reactive gas and a cleaning gas is supplied, are provided at side surfaces of the nozzles 410, 420 and 430, respectively. The gas supply ports 410a, the gas supply ports 420a and the gas supply ports 430a are provided corresponding to the wafer arrangement region in which the wafers 200 are arranged along a stacking direction of the wafers 200 (that is, the wafer arrangement direction). The gas supply ports 410a, the gas supply ports 420a and the gas supply ports 430a are open toward a center of the reaction tube 203. The gas supply ports 410a, the gas supply ports 420a and the gas supply ports 430a are provided from a lower portion to an upper portion of the reaction tube 203. An opening area of each of the gas supply ports 410a, the gas supply ports 420a and the gas supply ports 430a is the same, and each of the gas supply ports 410a, the gas supply ports 420a and the gas supply ports 430a is provided at the same pitch. However, the gas supply ports 410a, the gas supply ports 420a and the gas supply ports 430a are not limited thereto. For example, the opening area of each of the gas supply ports 410a, the gas supply ports 420a and the gas supply ports 430a may gradually increase from the lower portion to the upper portion of the reaction tube 203. In such a case, it is possible to further uniformize a flow rate of the gas supplied through the gas supply ports 410a, the gas supply ports 420a and the gas supply ports 430a.

The source gas (which is one of process gases) is supplied into the process chamber 201 through the gas supply pipe 310 provided with the MFC 312 and the valve 314 and the nozzle 410. A gas containing a metal element (also referred to as a "metal-containing gas") may be used as the source gas. For example, a gas containing aluminum (Al), which is an aluminum-containing source material (also referred to as an "aluminum-containing source gas" or an "aluminum-containing gas"), may be used as the metal-containing gas. For example, trimethylaluminum ($Al(CH_3)_3$, abbreviated as TMA) gas may be used as the Al-containing source gas. The TMA is an organic-based source material, and is an alkyl-aluminum in which an alkyl group is bonded to aluminum as a ligand.

In the present specification, the term "source gas" may refer to a source material in a gaseous state under the normal temperature and the normal pressure or a gas obtained by vaporizing a source material in a liquid state under the normal temperature and the normal pressure. Herein after, a gas obtained by vaporizing a liquid source may also be referred to as a "vaporized gas".

When the source gas which is self-decomposed at a predetermined temperature is supplied through the gas supply pipe 310, a source gas supplier (which is a source gas supply system) is constituted mainly by the gas supply pipe 310, the MFC 312 and the valve 314. The source gas supplier may further include the nozzle 410. The source gas supplier may also be referred to as a source supplier. When the metal-containing gas is supplied through the gas supply pipe 310, the source gas supplier may also be referred to as a metal-containing gas supply supplier (which is a source gas supply system).

When the aluminum-containing source material (the aluminum-containing source gas or the aluminum-containing gas) is used as the metal-containing gas, the metal-containing gas supplier may also be referred to as an aluminum-containing source supplier (an aluminum-containing source gas supplier or an aluminum-containing gas supplier). When TMA gas is used as the aluminum-containing source, the aluminum-containing source supplier may also be referred to as a TMA supplier.

When the reactive gas (also referred to as a "reactant"), which is one of the process gases, is supplied through the gas supply pipe 320, a reactive gas supplier (which is a reactive gas supply system) is constituted mainly by the gas supply pipe 320, the MFC 322 and the valve 324. The reactive gas supplier may also be referred to as a reactant supplier (which is a reactant supply system). The reactive gas supplier may further include the nozzle 420. When an oxygen-containing gas (also referred to as an "oxidizing gas" or an "oxidizing agent") is supplied as the reactive gas, the reactive gas supplier may also be referred to as an oxygen-containing gas supplier (an oxidizing gas supplier or an oxidizing agent supplier). When $O_3$ gas is used as the oxygen-containing gas, the oxygen-containing gas supplier may also be referred to as an $O_3$ gas supplier (which is an $O_3$ gas supply system). When the reactive gas flows through the nozzle 420, the nozzle 420 may also be referred to as a "reactive gas nozzle 420".

The cleaning gas (also referred to as an "etching gas"), which is one of process gases, is supplied into the process chamber 201 through the gas supply pipe 330 provided with the MFC 332 and the valve 334 and the nozzle 430. For example, one or more gas selected from the group of hydrogen chloride (HCl), silicon tetrachloride ($SiCl_4$), thionyl chloride ($SOCl_2$), boron tribromide ($BBr_3$), silicon tetrabromide ($SiBr_4$) and bromine ($Br_2$) may be used as the cleaning gas.

An inert gas is supplied into the process chamber 201 through the gas supply pipes 510, 520 and 530 provided with the MFCs 512, 522 and 532 and the valves 514, 524 and 534, respectively, and the nozzles 410, 420 and 430. For example, nitrogen gas ($N_2$ gas) may be used as the inert gas.

An inert gas supplier (which is an inert gas supply system) is constituted mainly by the gas supply pipes 510, 520 and 530, the MFCs 512, 522 and 532 and the valves 514, 524 and 534.

An end of an exhaust pipe 231 serving as an exhaust flow path through which an inner atmosphere of the process chamber 201 is exhausted is provided at the side wall of the manifold 209. A pressure sensor 245 and an APC (Automatic Pressure Controller) valve 243 are provided at the exhaust pipe 231. The pressure sensor 245 serves as a pressure detector (pressure meter) capable of detecting an inner pressure of the process chamber 201, and the APC valve 243 serves as an exhaust valve (pressure regulator). A vacuum pump 246 serving as a vacuum exhaust apparatus is provided at the other end of the exhaust pipe 231.

With the vacuum pump 246 in operation, the APC valve 243 may be opened or closed to vacuum-exhaust the process chamber 201 or stop the vacuum exhaust. With the vacuum pump 246 in operation, an opening degree of the APC valve 243 may be adjusted based on pressure information detected by the pressure sensor 245, in order to control (adjust) the inner pressure of the process chamber 201. An exhauster (which is an exhaust system) is constituted mainly by the exhaust pipe 231, the APC valve 243 and the pressure sensor 245. The exhauster may further include the vacuum pump 246. The present embodiments are not limited to an example in which the exhaust pipe 231 is provided at the manifold 209. The exhaust pipe 231 may be provided at the reaction tube 203 instead of the manifold 209. Similarly, the nozzles 410, 420 and 430 may be installed so as to penetrate a side wall of the reaction tube 203.

A seal cap 219 serving as a furnace opening lid capable of airtightly sealing a lower end opening of the manifold 209 is provided under the manifold 209. The seal cap 219 is made of a metal such as SUS (stainless steel), and is of a disk shape. An O-ring 220b serving as a seal provided on an upper surface of the seal cap 219 so as to be in contact with the lower end of the manifold 209. A rotator 267 capable of rotating the boat 217 described later is provided under the seal cap 219 opposite to the process chamber 201. A rotating shaft 255 of the rotator 267 is connected to the boat 217 through the seal cap 219.

The seal cap 219 may be elevated or lowered in the vertical direction by a boat elevator 115 provided outside the reaction tube 203 vertically. When the seal cap 219 is elevated or lowered by the boat elevator 115, the boat 217 placed on the seal cap 219 may be transferred (loaded) into the process chamber 201 or transferred (unloaded) out of the process chamber 201. The boat elevator 115 serves as a transfer device (or a transport device) capable of loading the boat 217 (that is, the wafers 200 accommodated in the boat 217) into the process chamber 201 or unloading the boat 217 (that is, the wafers 200 accommodated in the boat 217) out of the process chamber 201.

The boat 217 serving as a substrate retainer is configured to align the wafers 200, for example, from 25 to 200 wafers in the vertical direction and configured to support the wafers 200 in a multistage manner, while the wafers 200 are horizontally oriented with their centers aligned with each other. That is, the boat 217 supports (accommodates) the wafers 200 with a predetermined interval therebetween. A top plate 215 is provided on a top of the boat 217. The boat 217 and the top plate 215 are made of a heat resistant material such as quartz and SiC. A plurality of insulating plates 218 are provided under the boat 217 in a multistage manner. The insulating plates 218 are made of a heat resistant material such as quartz and SiC.

Figure 2:
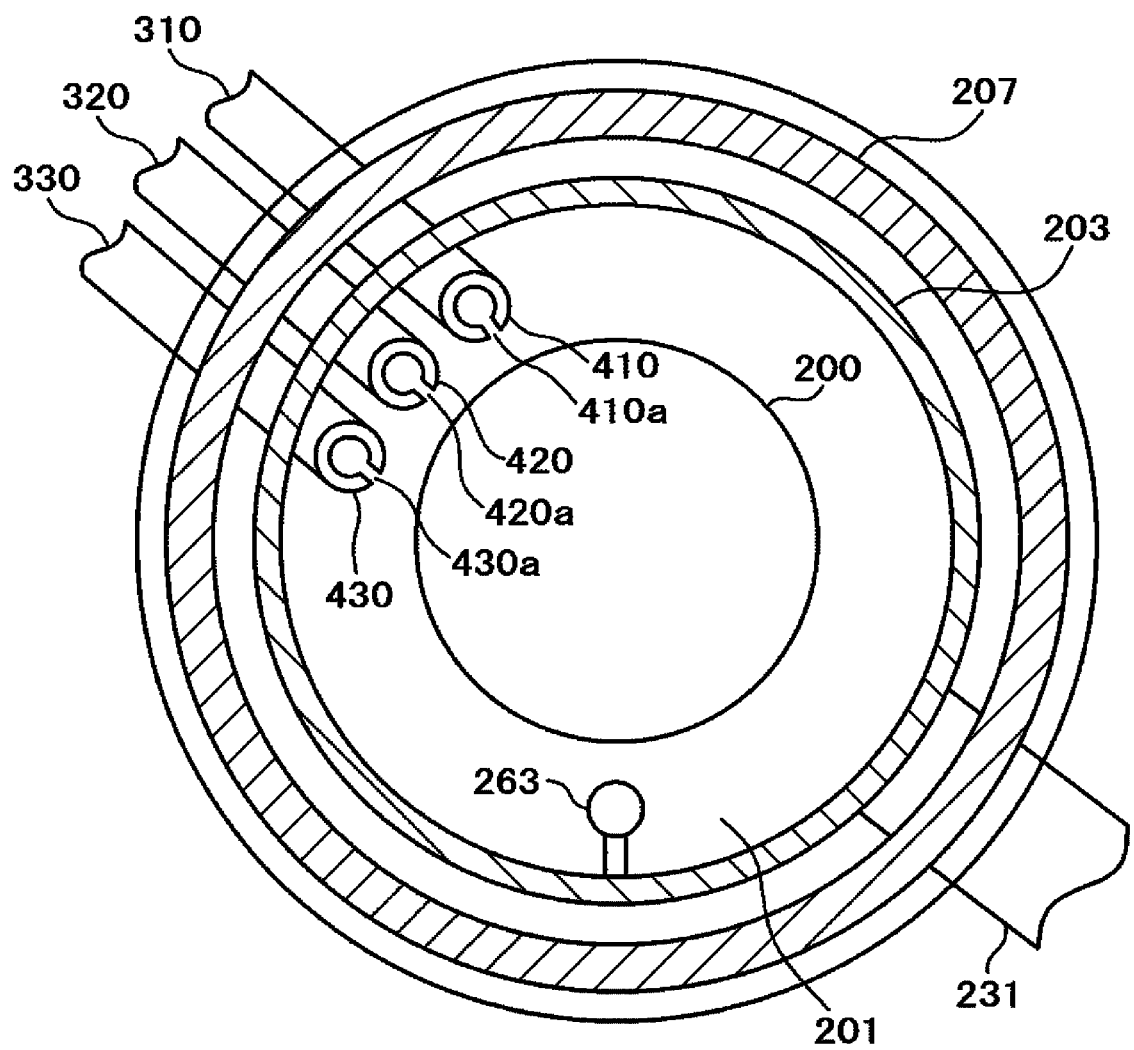
FIG. 2 schematically illustrates a horizontal cross-section taken along the line A-A of the vertical type process furnace of the substrate processing apparatus preferably used in the embodiments shown in FIG. 1.

As shown in FIG. 2, a temperature sensor 263 serving as a temperature detector is provided in the process chamber 201. The state of electric conduction to the heater 207 is adjusted based on temperature information detected by the temperature sensor 263 such that a desired temperature distribution of an inner temperature of the process chamber 201 can be obtained. Similar to the nozzles 410 and 420, the temperature sensor 263 is provided along the inner wall of the reaction tube 203.

Figure 3:
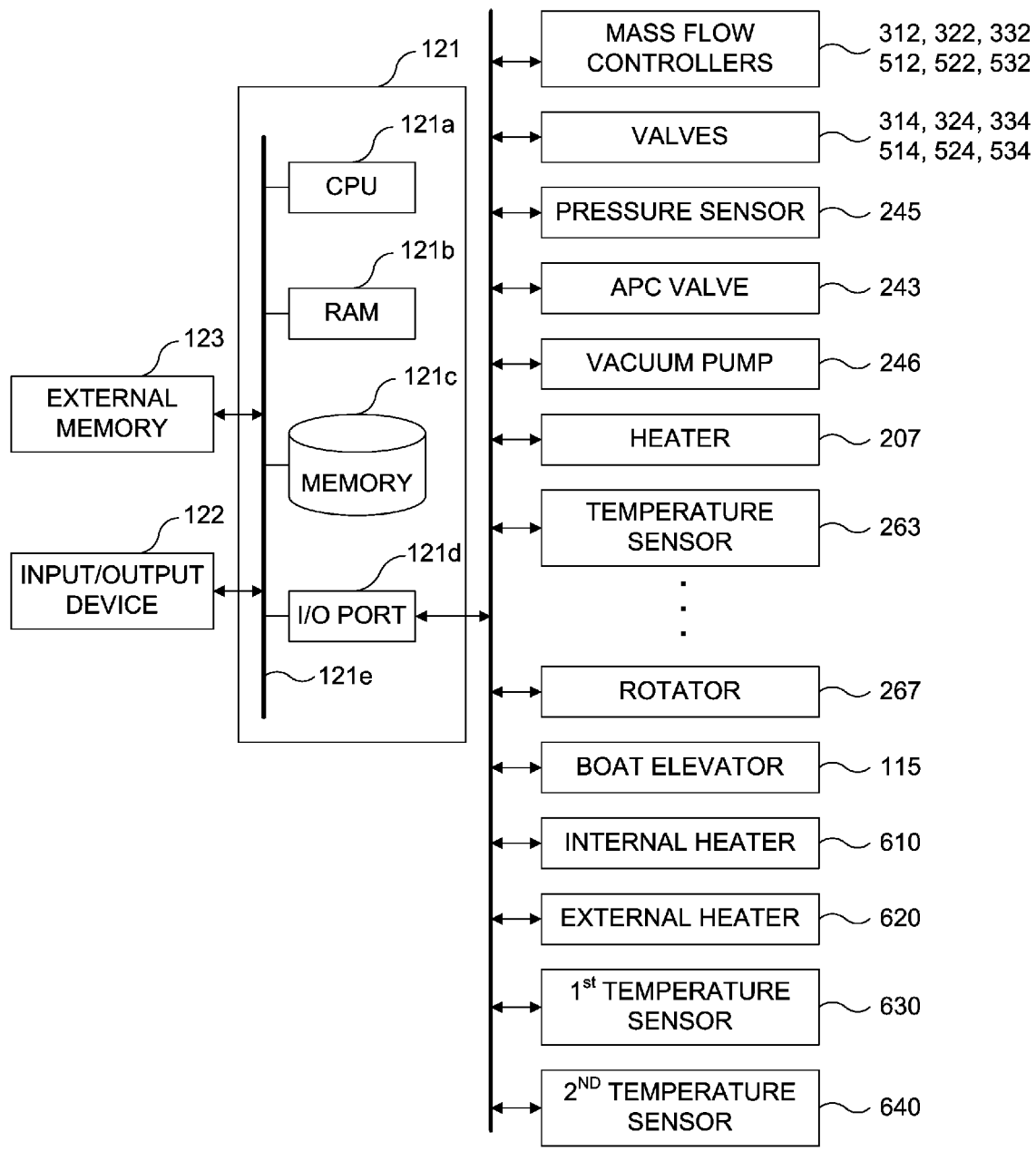
FIG. 3 is a block diagram schematically illustrating a configuration of a controller and related components of the substrate processing apparatus preferably used in the embodiments described herein.

As shown in FIG. 3, a controller 121 serving as a control device (control structure) is constituted by a computer including a CPU (Central Processing Unit) 121a, a RAM (Random Access Memory) 121b, a memory 121c and an I/O port 121d. The RAM 121b, the memory 121c and the I/O port 121d may exchange data with the CPU 121a through an internal bus 121e. For example, an input/output device 122 such as a touch panel is connected to the controller 121.

The memory 121c is configured by components such as a flash memory and a hard disk drive (HDD). For example, a control program configured to control a temperature of a liquid source, a control program configured to control the operation of the substrate processing apparatus 10 or a process recipe containing information on the sequences and conditions of a method of manufacturing a semiconductor device (that is, a process such as a film-forming process and an etching process (cleaning process) described later) may be readably stored in the memory 121c. The process recipe is obtained by combining processes (steps) of the substrate processing such as the film-forming process described later such that the controller 121 can execute the processes (steps) to acquire a predetermine result, and functions as a program. Hereafter, the process recipe and the control program may be collectively or individually referred to as a "program". In the present specification, the term "program" may indicate the process recipe alone, may indicate the control program alone, or may indicate both of the process recipe and the control program. The RAM 121b functions as a memory area (work area) where a program or data read by the CPU 121a is temporarily stored.

The I/O port 121d is connected to the above-described components such as the mass flow controllers (MFCs) 312, 322, 332, 512, 522 and 532, the valves 314, 324, 334, 514, 524 and 534, the pressure sensor 245, the APC valve 243, the vacuum pump 246, the heater 207, the temperature sensor 263, the rotator 267, the boat elevator 115, an internal heater 610, an external heater 620, a first temperature sensor 630 and a second temperature sensor 640.

When a controller (not shown) configured to control the internal heater 610 and the external heater 620 provided in a liquid vessel 600 of a vaporizer 60, which will be described later, and the controller 121 configured to control the substrate processing apparatus 10 may be separately provided. In such a case, the controller (not shown) configured to control the internal heater 610 and the external heater 620 may be connected to the controller 121 configured to control the substrate processing apparatus 10.

For example, at least one among the first temperature sensor 630, the second temperature sensor 640, the internal heater 610 and the external heater 620 may be connected to the controller (not shown) configured to control the internal heater 610 and the external heater 620.

The CPU 121a is configured to read a control program from the memory 121c and execute the read control program. In addition, the CPU 121a is configured to read a recipe from the memory 121c in accordance with an operation command inputted from the input/output device 122. According to the contents of the read recipe, the CPU 121a may be configured to control various operations such as flow rate adjusting operations for various gases by the MFCs 312, 322, 332, 512, 522 and 532, opening/closing operations of the valves 314, 324, 334, 514, 524 and 534, an opening/closing operation of the APC valve 243, a pressure adjusting operation by the APC valve 243 based on the pressure sensor 245, a temperature adjusting operation of the heater 207 based on the temperature sensor 263, a start and stop of the vacuum pump 246, an operation of adjusting a rotation and a rotation speed of the boat 217 by the rotator 267, an elevating and lowering operation of the boat 217 by the boat elevator 115, an operation of accommodating the wafers 200 into the boat 217, and an operation of adjusting a temperature of the liquid source by the internal heater 610 based on the first temperature sensor 630 and the external heater 620 based on the second temperature sensor 640.

The controller 121 may be embodied by installing the above-described program stored in an external memory 123 into a computer. For example, the external memory 123 may include a magnetic tape, a magnetic disk such as a flexible disk and a hard disk, an optical disk such as a CD and a DVD, a magneto-optical disk such as an MO and a semiconductor memory such as a USB memory and a memory card. The memory 121c or the external memory 123 may be embodied by a non-transitory computer readable recording medium. Hereafter, the memory 121c and the external memory 123 are collectively or individually referred to as recording medium. In the present specification, the term "recording medium" may indicate the memory 121c alone, may indicate the external memory 123 alone, and may indicate both of the memory 121c and the external memory 123. Instead of the external memory 123, a communication instrument such as the Internet and a dedicated line may be used for providing the program to the computer.

(2) Configuration of Vaporizer

Subsequently, the vaporizer 60 capable of generating the process gases by storing and vaporizing the liquid source will be described with reference to FIG. 4.

Figure 4:
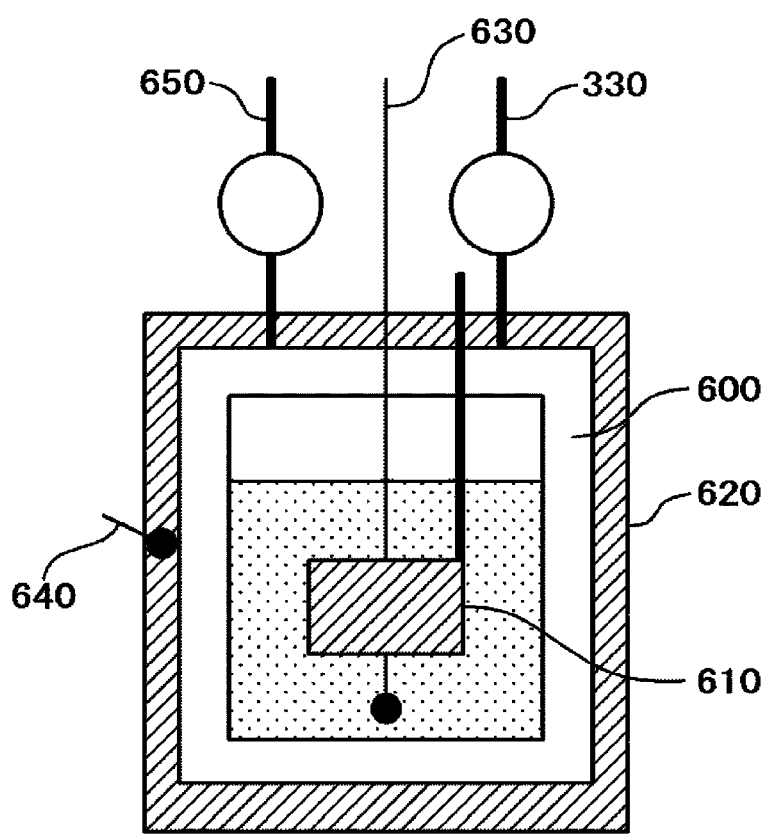
FIG. 4 schematically illustrates a configuration of a vaporizer of the substrate processing apparatus preferably used in the embodiments described herein.

As shown in FIG. 4, the gas supply pipe 330 through which the cleaning gas serving as one of the process gases is supplied into the process chamber 201 and a gas supply pipe 650 through which the liquid source of the cleaning gas is supplied into the liquid vessel 600 are provided at the liquid vessel 600. The liquid source of the cleaning gas comprises a source material from which the cleaning gas is made. For example, a silicon tetrachloride ($SiCl_4$) liquid serving as the liquid source of the cleaning gas is stored in the liquid vessel 600, and the cleaning gas vaporized by a vapor draw method is introduced into the gas supply pipe 330, and is supplied into the process chamber 201 through the gas supply pipe 330, the MFC 332 and the valve 334. As a result, a film adhered to an inside of the process chamber 201 is etched to be cleaned. The liquid vessel 600 is of a cylindrical shape, and a cross-section of the liquid vessel 600 inside the liquid vessel 600 is uniform. For example, the liquid vessel 600 is made of a metal material such as stainless steel (SUS).

Further, in the liquid vessel 600 are provided the internal heater 610 serving as a first heater (which is a first heating apparatus) capable of heating the liquid source by immersion into the liquid source, the first temperature sensor 630 (for example, a thermocouple) capable of measuring the temperature of the liquid source by immersion into the liquid source so as to control the internal heater 610 and the second temperature sensor 640 (for example, a thermocouple) capable of measuring a temperature of an outer wall of the liquid vessel 600 to control the external heater 620 described later. A component such as a power supply (not shown) is connected to the internal heater 610. A temperature of the internal heater 610 is feedback-controlled by using a control operation such as a PID control operation based on the temperature measured by the first temperature sensor 630 such that the temperature measured by the first temperature sensor 630 (that is, the measured temperature of the liquid source) reaches and is maintained at a predetermined temperature. Thereby, the temperature of the internal heater 610 is adjusted. The second temperature sensor 640 may be provided in a heat insulating cloth of the external heater 620, or may be provided such that the second temperature sensor 640 directly contacts the outer wall of the liquid vessel 600.

Figure 5:
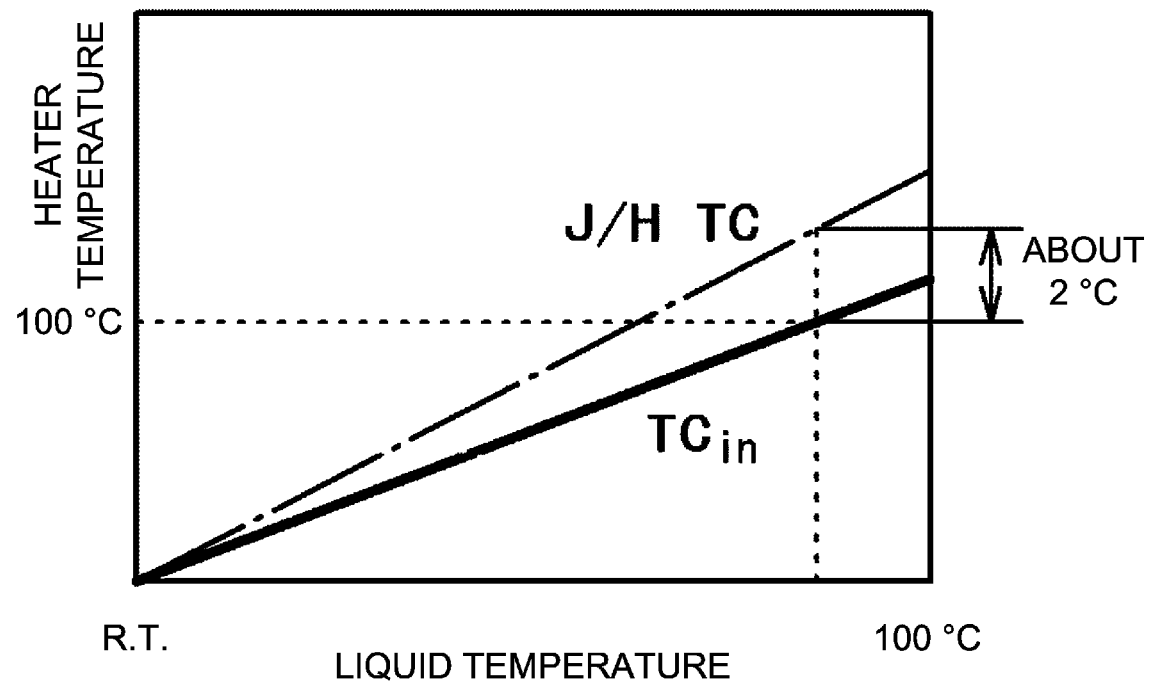
FIG. 5 schematically illustrates an example of setting a temperature of a heater of the vaporizer according to the embodiments described herein.

The liquid vessel 600 is covered with the external heater (for example, a jacket heater) 620 serving as a second heater (which is a second heating apparatus) capable of heating the liquid vessel 600 and the liquid source inside the liquid vessel 600. A component such as a power supply (not shown) is connected to the external heater 620. A temperature of the external heater 620 is adjusted based on the temperature measured by the second temperature sensor 640 such that the temperature measured by the second temperature sensor 640 (that is, the measured temperature of the outer wall of the liquid vessel 600) reaches and is maintained at a predetermined temperature. For example, the external heater 620 heats the liquid source through the heat insulating cloth (not shown) of the external heater 620 and the liquid vessel 600. Therefore, as shown in FIG. 5, it is possible to stably control the temperature of the liquid source (indicated by "LIQUID TEMPERATURE" in FIG. 5) by controlling the temperatures (indicated by "HEATER TEMPERATURE" in FIG. 5) of the internal heater 610 and the external heater 620 such that the temperature of the external heater 620 (also referred to as a "second temperature") is higher than the temperature of the internal heater 610 (also referred to as a "first temperature"). In FIG. 5, "R.T." refers to the room temperature. For example, when controlling an amount of the electric power applied to the internal heater 610 such that the measured temperature ("TCin" in FIG. 5) of the first temperature sensor 630 reaches and is maintained at 100° C., it is preferable to control an amount of the electric power applied to the external heater 620 such that the measured temperature ("J/H TC" in FIG. 5) of the second temperature sensor 640 is about 102° C.

Figure 6:
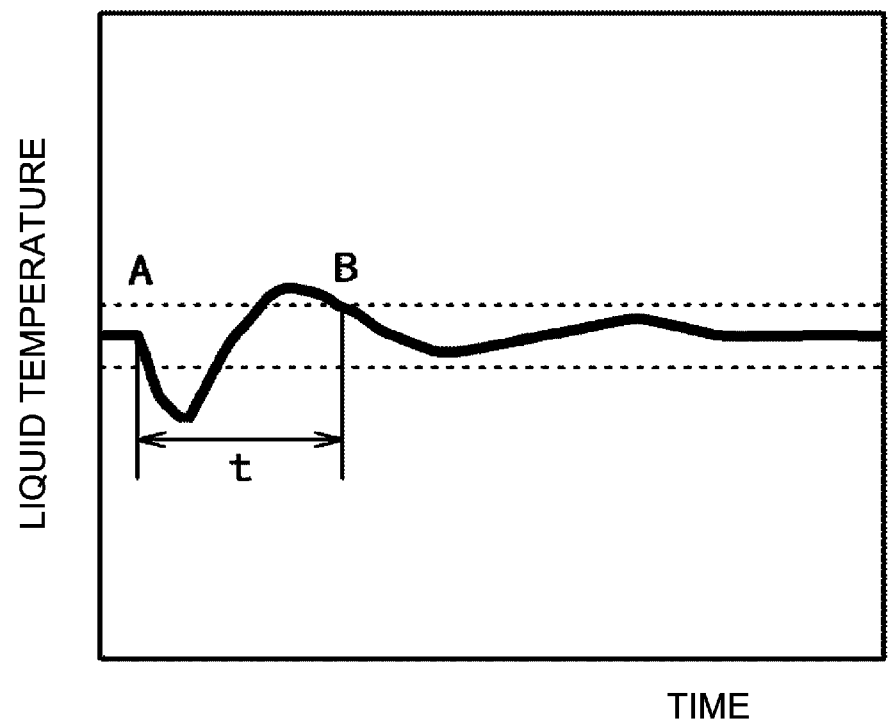
FIG. 6 schematically illustrates a stability of a liquid temperature of a liquid vessel according to the embodiments described herein.
Figure 7:
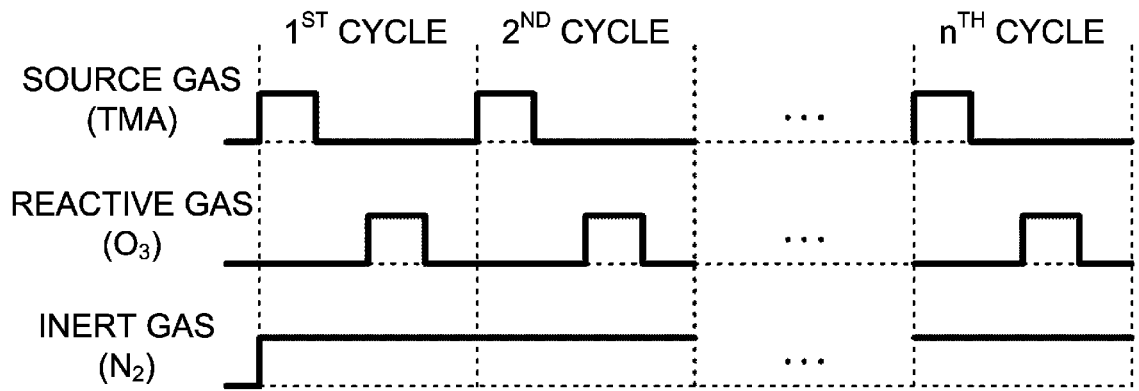
FIG. 7 is a timing diagram schematically illustrating a film-forming sequence when a film is formed on a wafer according to the embodiments described herein.

An exemplary operation of the vaporizer 60 will be described. When the cleaning gas is supplied from the liquid vessel 600 to the process chamber 201 through the gas supply pipe 330 provided with the MFC 332 and the valve 334 and the nozzle 430, the temperature of the liquid source in the liquid vessel 600 is measured by the first temperature sensor 630 and the temperature of the outer wall of the liquid vessel 600 heated by the external heater 620 is measured by the second temperature sensor 640. When the first temperature sensor 630 measures the temperature of the liquid source, the temperature of the liquid source is in the process of being rapidly lowered by the vaporization heat. The temperature of the internal heater 610 (the power applied to the internal heater 610) is adjusted such that the temperature of the liquid source reaches and is maintained at a predetermined temperature based on the temperature of the liquid source measured by the first temperature sensor 630, and the temperature of the external heater 620 (the power applied to the external heater 620) is adjusted such that the temperature of the outer wall of the liquid vessel 600 reaches and is maintained at a predetermined temperature based on the temperature of the outer wall of the liquid vessel 600 measured by the second temperature sensor 640. Therefore, even when the temperature of the liquid source is lowered sharply after the supply of the cleaning gas is started, by heating the liquid source by the internal heater 610 and the external heater 620, it is possible to suppress an amount of a temperature drop of the liquid source and it is also possible to elevate the temperature of the liquid source in a short time. In addition, by suppressing the amount of the temperature drop of the liquid source, it is possible to suppress an amount of the overshoot of the temperature of the liquid source which may occur by heating the liquid source. For example, as shown in FIG. 6, it is possible to shorten a time ("t" in FIG. 6) from a start of the supply of the liquid vaporization ("A" in FIG. 6) to a stable recovery of the temperature of the liquid source ("B" in FIG. 6) (that is, a temperature within +1% of a pre-set temperature) from the conventional 60 minutes to 5 minutes or less.

With such a configuration, by individually controlling the internal heater 610 and the external heater 620, it is possible to improve the responsiveness and the stability of the temperature of the liquid source, and it is also possible to recover the temperature of the liquid source to a predetermined temperature range in a short time. Further, since the temperature of the liquid source can be elevated to a predetermined temperature in a short time, it is possible to prevent a saturated vapor pressure from being lowered, which occurs when the temperature of the liquid source is rapidly lowered due to the vaporization heat generated when the cleaning gas is supplied. In addition, since the vapor pressure for the liquid source can be secured, it is possible to prevent a decrease in a flow rate of the cleaning gas.

According to the vaporizer 60 of the present embodiments, when the liquid source is heated to 100° C. with $A=250$ cm$^2$, it is possible to stably supply the gas whose flow rate is equal to or greater than 6 slm. That is, a relationship of $Q/A \geq 2.4\%$ can be satisfied where the symbol "A" denotes a cross-sectional area (in unit of cm$^2$) of the liquid vessel 600 and the symbol "Q" denotes a flow rate (supply gas flow rate) (in unit of slm) of the gas generated by the vaporization (that is, the vaporized gas). In addition, even under a condition that the temperature drop of the liquid source at the start of the vaporization is great (for example, in a region in which a relationship of $Q/A>2.0\%$ is satisfied), it is possible to stably supply the vaporized gas. Specifically, even when the first temperature and the second temperature are set to predetermined values such that the relationship of $Q/A>2.0\%$ is satisfied, it is possible to stably supply the vaporized gas. The vaporizer 60 according to the present embodiments may be applied even in a region in which a relationship of $Q/A \leq 2.0\%$ is satisfied. However, since that the temperature drop of the liquid source at the start of the vaporization is small in the region in which the relationship of $Q/A \leq 2.0\%$ is satisfied, it is preferable that the vaporizer 60 according to the present embodiments is applied to the region in which the relationship of $Q/A>2.0\%$ is satisfied.

A vaporization temperature is determined according to a desired vaporization amount. That is, the higher the vaporization temperature, the larger the vaporization amount. However, when the vaporization temperature is too high, a thermal decomposition of the source material may occur. Therefore, it is preferable that the vaporization temperature is lower than a temperature at which the thermal decomposition of the source material occurs. Usually, a flow rate of the source gas used in the film-forming process is lower than such a high flow rate (5 slm or more) as described above. However, it is preferable that the cleaning gas is supplied at the high flow rate in order to increase a pressure elevation rate in the process furnace 202, (that is, to increase a concentration of the cleaning gas and to increase an etching amount per cycle). Therefore, the vaporizer 60 according to the present embodiments capable of supplying the vaporized gas at the large flow rate (for example, 5 slm or more) can be more preferably applied to the supply of the cleaning gas.

While the present embodiments are described by way of an example in which the vaporizer 60 is configured as a vaporizer of the cleaning gas, the present embodiments are not limited thereto. For example, the vaporizer 60 may be configured as a vaporizer of the process gases (that is, a vaporizer of the source gas or a vaporizer of the reactive gas) instead of the vaporizer of the cleaning gas.

(3) Substrate Processing

Hereinafter, as a part of a manufacturing process of the semiconductor device, an example of the substrate processing (that is, the film-forming process) of forming a film on the wafer 200 to manufacture the semiconductor device by using the substrate processing apparatus 10 will be described. In the following description, operations of the components constituting the substrate processing apparatus 10 are controlled by the controller 121.

In the present specification, the term "wafer" may refer to "a wafer itself" or may refer to "a wafer and a stacked structure (aggregated structure) of predetermined layers or films formed on a surface of the wafer". That is, the term "wafer" may collectively refer to "the wafer and the layers or the films formed on the surface of the wafer. In addition, in the present specification, the term "a surface of a wafer" may refer to "a surface (exposed surface) of a wafer itself" or may refer to "a surface of a predetermined layer or a film formed on a wafer, i.e., a top surface (uppermost surface) of the wafer as a stacked structure". In the present specification, the terms "substrate" and "wafer" may be used as substantially the same meaning. That is, the term "wafer" may be substituted by "substrate" and vice versa.

A film-forming sequence of forming a film on the wafer 200 using the substrate processing apparatus 10 will be described. According to the present embodiments, the process chamber 201 in which the wafers 200 are accommodated is heated at a predetermined temperature. Then, a cycle including a source gas supply step of supplying the TMA gas serving as the source gas into the process chamber 201 through the gas supply ports 410a of the nozzle 410 and a reactive gas supply step of supplying the reactive gas into the process chamber 201 through the gas supply ports 420a of the nozzle 420 is performed a predetermined number of times (n times). As a result, an aluminum oxide film (AlO film) is formed on the wafer 200 as a film containing aluminum (Al) and oxygen (O).

<Wafer Charging Step and Boat Loading Step>

The wafers 200 are charged (transferred) into the boat 217 (wafer charging step). Specifically, after the boat 217 is charged with the wafers 200, as shown in FIG. 1, the boat 217 charged with the wafers 200 is elevated by the boat elevator 115 and loaded (transferred) into the process chamber 201 (boat loading step). With the boat 217 loaded, the seal cap 219 seals the lower end opening of the manifold 209 via the O-ring 220b.

<Pressure and Temperature Adjusting Step>

The vacuum pump 246 exhausts (vacuum-exhausts) the inner atmosphere of the process chamber 201 such that the inner pressure of the process chamber 201 reaches and is maintained at a predetermined pressure (vacuum degree). While exhausting the inner atmosphere of the process chamber 201, the inner pressure of the process chamber 201 is measured by the pressure sensor 245, and the APC valve 243 is feedback-controlled based on the measured pressure information (pressure adjusting step). The vacuum pump 246 continuously vacuum-exhausts the inner atmosphere of the process chamber 201 until at least the processing of the wafer 200 is completed. The heater 207 heats the process chamber 201 such that the inner temperature of the process chamber 201 reaches and is maintained at a desired temperature. The state of the electric conduction to the heater 207 is feedback-controlled based on the temperature information detected by the temperature sensor 263 such that a desired temperature distribution of the inner temperature of the process chamber 201 can be obtained (temperature adjusting step). The heater 207 continuously heats the process chamber 201 until at least the processing of the wafer 200 is completed.

Then, the rotator 267 rotates the wafers 200 by rotating the boat 217. The rotator 267 continuously rotates the boat 217 and the wafers 200 accommodated in the boat 217 until at least the processing of the wafer 200 is completed.

<Film-forming Step>

Thereafter, the film-forming step is performed by performing the cycle including the source gas supply step (also referred to as a "first gas supply step"), a first residual gas removing step, the reactive gas supply step (also referred to as a "second gas supply step") and a second residual gas removing step, which are performed sequentially in order.

<Source Gas Supply Step>

The valve 314 is opened to supply the TMA gas serving as the source gas into the gas supply pipe 310. After a flow rate of the TMA gas is adjusted by the MFC 312, the TMA gas whose flow rate is adjusted is supplied into the process chamber 201 through the gas supply ports 410a of the nozzle 410. Simultaneously, the valve 514 is opened to supply the $N_2$ gas serving as the inert gas (carrier gas) into the gas supply pipe 510. After a flow rate of the $N_2$ gas serving as the carrier gas is adjusted by the MFC 512, the $N_2$ gas whose flow rate is adjusted is supplied with the TMA gas serving as the source gas into the process chamber 201 through the gas supply ports 410a of the nozzle 410, and is exhausted through the exhaust pipe 231. In the source gas supply step, in order to prevent the TMA gas serving as the source gas from entering the nozzle 420 (that is, in order to prevent the TMA gas from flowing back to the nozzle 420), the valve 524 is opened to supply the $N_2$ gas serving as the carrier gas into the gas supply pipe 520. The $N_2$ gas serving as the carrier gas is supplied into the process chamber 201 through the gas supply pipe 520 and the nozzle 420, and is exhausted through the exhaust pipe 231.

In the source gas supply step, for example, the APC valve 243 is appropriately adjusted such that the inner pressure of the process chamber 201 is set to be a predetermined pressure within a range from 1 Pa to 1,000 Pa, preferably from 1 Pa to 100 Pa, and more preferably from 10 to 50 Pa.

For example, a supply flow rate of the TMA gas adjusted by the MFC 312 is set to be a predetermined flow rate within a range from 10 sccm to 2,000 sccm, preferably from 50 sccm to 1,000 sccm, and more preferably from 100 sccm to 500 sccm. In the present specification, a notation of a numerical range such as "from 10 sccm to 2,000 sccm" means that a lower limit and an upper limit are included in the numerical range. That is, the notation of the numerical range "from 10 sccm to 2,000 sccm" means a range equal to or higher than 10 sccm and equal to or lower than 2,000 sccm. The same also applies to other numerical ranges described herein such as a pressure, a time and a temperature.

For example, a supply flow rate of the $N_2$ gas serving as the carrier gas adjusted by the MFC 512 is set to be a predetermined flow rate within a range from 1 slm to 30 slm. For example, a time duration of supplying the TMA gas serving as the source gas onto the wafer 200 is set to be a predetermined time within a range from 1 second to 60 seconds, preferably from 1 second to 20 seconds, and more preferably from 2 seconds to 15 seconds.

In the source gas supply step, for example, the heater 207 heats the wafer 200 such that the temperature of the wafer 200 is set to be a predetermined temperature within a range from 200° C. to 600° C., preferably from 350° C. to 550° C., and more preferably from 400° C. to 550° C.

By supplying the TMA into the process chamber 201 according to the above-described processing conditions, an aluminum-containing layer is formed on the uppermost surface of the wafer 200. The aluminum-containing layer may contain chlorine (Cl) and hydrogen (H) in addition to aluminum (Al). The aluminum-containing layer may be formed by the physical adsorption of the TMA gas on the uppermost surface of the wafer 200, by the chemical adsorption of substances generated by decomposing a part of the TMA gas on the uppermost surface of the wafer 200, or by the deposition of aluminum generated by the thermal decomposition of the TMA gas on the uppermost surface of the wafer 200. That is, the aluminum-containing layer may be an adsorption layer (a physical adsorption layer or a chemical adsorption layer) of the TMA gas or the substances generated by decomposing a part of the TMA gas, or may be an aluminum deposition layer (an aluminum layer).

<First Residual Gas Removing Step>

After the aluminum-containing layer is formed in the source gas supply step, the valve 314 is closed to stop the supply of the TMA gas into the process chamber 201. With the APC valve 243 open, the vacuum pump 246 vacuum-exhausts the inner atmosphere of the process chamber 201 to remove a residual gas such as a residual TMA gas serving as the source gas which did not react or which contributed to the formation of the aluminum-containing layer from the process chamber 201. By maintaining the valves 514 and 524 open, the $N_2$ gas serving as the carrier gas is continuously supplied into the process chamber 201.

<Reactive Gas Supply Step>

After the residual gas such as the residual TMA gas is removed from the process chamber 201, the valve 324 is opened to supply the $O_3$ gas serving as the reactive gas into the gas supply pipe 320. After a flow rate of the $O_3$ gas is adjusted by the MFC 322, the $O_3$ gas whose flow rate is adjusted is supplied to the wafer 200 in the process chamber 201 through the gas supply ports 420a of the nozzle 420, and is exhausted through the exhaust pipe 231. That is, the wafer 200 is exposed to the $O_3$ gas) serving as the reactive gas.

In the reactive gas supply step, the valve 524 is opened to supply the $N_2$ gas serving as the carrier gas into the gas supply pipe 520. After the flow rate of the $N_2$ gas serving as the carrier gas is adjusted by the MFC 522, the $N_2$ gas whose flow rate is adjusted is supplied with the $O_3$ gas serving as the reactive gas into the process chamber 201, and is exhausted through the exhaust pipe 231. In the reactive gas supply step, in order to prevent the $O_3$ gas serving as the reactive gas from entering the nozzle 410 (that is, in order to prevent the $O_3$ gas from flowing back to the nozzle 410), the valve 514 is opened to supply the $N_2$ gas serving as the carrier gas into the gas supply pipe 510. The $N_2$ gas serving as the carrier gas is supplied into the process chamber 201 through the gas supply pipe 510 and the nozzle 410, and is exhausted through the exhaust pipe 231.

In the reactive gas supply step, for example, the APC valve 243 is appropriately adjusted such that the inner pressure of the process chamber 201 is set to be a predetermined pressure within a range from 1 Pa to 1,000 Pa. For example, a supply flow rate of the $O_3$ gas serving as the reactive gas adjusted by the MFC 322 is set to be a predetermined flow rate within a range from 5 slm to 40 slm, preferably from 5 slm to 30 slm, and more preferably from 10 slm to 20 slm. For example, a time duration of supplying the $O_3$ gas serving as the reactive gas onto the wafer 200 is set to be a predetermined time within a range from 1 second to 60 seconds. Other processing conditions of the reactive gas supply step are the same as those of the source gas supply step.

In the reactive gas supply step, the $O_3$ gas serving as the reactive gas and the $N_2$ gas serving as the inert gas are supplied into the process chamber 201 without any other gas being supplied into the process chamber 201 together with the $O_3$ gas and the $N_2$ gas. The $O_3$ gas reacts with at least a portion of the aluminum-containing layer formed on the wafer 200 in the source gas supply step. Then, the aluminum-containing layer is oxidized to form an aluminum oxide layer (also referred to as an "AlO layer") containing aluminum (Al) and oxygen (O) serving as a metal oxide layer. That is, the aluminum-containing layer is modified into the AlO layer.

<Second Residual Gas Removing Step>

After the AlO layer is formed, the valve 324 is closed to stop the supply of the $O_3$ gas serving as the reactive gas. In the second residual gas removing step, with the APC valve 243 open, the vacuum pump 246 vacuum-exhausts the inner atmosphere of the process chamber 201 to remove a residual gas such as a residual $O_3$ gas in the process chamber 201 which did not react or which contributed to the formation of the AlO layer or the reaction by-products from the process chamber 201 in the same manner as in the first residual gas removing step.

The cycle wherein the source gas supply step, the first residual gas removing step, the reactive gas supply step and the second residual gas removing step are sequentially performed in order is performed a predetermined number of times (one or more times). By performing a batch process (that is, by performing a plurality of steps a plurality of times) as described above, the AlO film is formed on the wafer 200.

In the present embodiments, the term "batch process" refers to a process of forming the AlO film is formed on the wafer 200 by performing the cycle wherein the source gas supply step, the first residual gas removing step, the reactive gas supply step and the second residual gas removing step are sequentially performed in order a predetermined number of times. By performing the batch process, the AlO film is formed on the wafer 200.

<After-Purge Step and Returning to Atmospheric Pressure Step>

The inert gas such as the $N_2$ gas is supplied into the process chamber 201 through each of the gas supply pipes 510, 520 and 530, and then the $N_2$ gas supplied into the process chamber 201 is exhausted through the exhaust pipe 231. The $N_2$ gas serves as the purge gas, and the inner atmosphere of the process chamber 201 is purged with the $N_2$ gas. Thus, the gas remaining in the process chamber 201 or the reaction by-products remaining in the process chamber 201 are removed from the process chamber 201 (after-purge step). Thereafter, the inner atmosphere of the process chamber 201 is replaced with the $N_2$ gas serving as the inert gas (substitution by inert gas), and the inner pressure of the process chamber 201 is returned to the normal pressure (atmospheric pressure) (returning to atmospheric pressure step).

<Boat Unloading Step and Wafer Discharging Step>

Thereafter, the seal cap 219 is lowered by the boat elevator 115 and the lower end opening of the manifold 209 is opened. The boat 217 with the processed wafers 200 charged therein is unloaded out of the reaction tube 203 through the lower end opening of the manifold 209 (boat unloading step). Then, the processed wafers 200 are discharged (transferred) from the boat 217 (wafer discharging step).

Subsequently, the etching process (cleaning process) of etching substances such as the film adhered to the inside of the process chamber 201 will be described.

<Boat Loading Step>

The boat 217 without accommodating the wafers 200 is loaded into the process chamber 201 (boat loading step). Specifically, the boat 217 without accommodating the wafers 200 is elevated by the boat elevator 115 and loaded into the process chamber 201. With the boat 217 loaded, the seal cap 219 seals the lower end opening of the manifold 209 via the O-ring 220b.

<Pressure and Temperature Adjusting Step>

The vacuum pump 246 exhausts (vacuum-exhausts) the inner atmosphere of the process chamber 201 such that the inner pressure of the process chamber 201 reaches and is maintained at a predetermined pressure (vacuum degree). While exhausting the inner atmosphere of the process chamber 201, the inner pressure of the process chamber 201 is measured by the pressure sensor 245, and the APC valve 243 is feedback-controlled based on the measured pressure information (pressure adjusting step). The vacuum pump 246 continuously vacuum-exhausts the inner atmosphere of the process chamber 201 until at least the etching process is completed. The heater 207 heats the process chamber 201 such that the inner temperature of the process chamber 201 reaches and is maintained at a desired temperature. The state of the electric conduction to the heater 207 is feedback-controlled based on the temperature information detected by the temperature sensor 263 such that a desired temperature distribution of the inner temperature of the process chamber 201 can be obtained (temperature adjusting step). The heater 207 continuously heats the process chamber 201 until at least the etching process is completed.

<Etching Process (Cleaning Process)>

Thereafter, the etching process (cleaning process) of etching the substances such as the film adhered to the inside of the process chamber 201 is performed by performing a cycle including an etching step, a third residual gas removing step, a surface oxidation step and a fourth residual gas removing step, which are performed sequentially in order.

<Etching Step>

For example, the vaporized gas of the silicon tetrachloride ($SiCl_4$) is obtained by heating the $SiCl_4$ serving as the liquid source in the liquid vessel 600 whose volume is 4 liters (whose cross-sectional area is 250 cm$^2$) to 100° C. The valve 334 is opened to supply $SiCl_4$ gas serving as the cleaning gas (etching gas) obtained by vaporizing a $SiCl_4$ liquid source in the liquid vessel 600 into the gas supply pipe 330. After a flow rate of the $SiCl_4$ gas is adjusted by the MFC 332, the $SiCl_4$ gas whose flow rate is adjusted is supplied into the process chamber 201 through the gas supply ports 430*a* of the nozzle 430, and is exhausted through the exhaust pipe 231. Simultaneously, the valve 534 is opened to supply the $N_2$ gas serving as the inert gas into the gas supply pipe 530. After a flow rate of the $N_2$ gas serving as the carrier gas is adjusted by the MFC 532, the $N_2$ gas whose flow rate is adjusted is supplied with the $SiCl_4$ gas serving as the cleaning gas into the process chamber 201, and is exhausted through the exhaust pipe 231. In the etching step, in order to prevent the $SiCl_4$ gas from entering the nozzles 410 and 420, the valves 514 and 524 are opened to supply the $N_2$ gas into the gas supply pipes 510 and 520. The $N_2$ gas is supplied into the process chamber 201 through the gas supply pipes 310 and 320 and the nozzles 410 and 420, and is exhausted through the exhaust pipe 231.

By supplying the $SiCl_4$ gas, at least a portion of the AlO film adhered to the inside of the process chamber 201 reacts with the $SiCl_4$ gas, and is removed from the process chamber 201.

In the etching step, for example, the heater 207 is appropriately controlled by the controller 121 to heat the inside of the process chamber 201 to a predetermined temperature within a range from 200° C. to 800° C., preferably from 400° C. to 650° C. such that the $SiCl_4$ gas is activated. In the etching step, for example, the APC valve 243 may be closed or substantially closed to an extent that the etching process is not affected. Thereby, the $SiCl_4$ gas is filled in the process chamber 201. By filling the $SiCl_4$ gas in the process chamber 201, it is possible to reduce an influence of the reaction delay on the etching step. In the etching step, for example, the inner pressure of the process chamber 201 is set to be a predetermined pressure (that is, a first pressure) within a range from 1 Pa to 40,000 Pa, preferably from 10,000 Pa to 30,000 Pa, and more preferably from 20,000 Pa to 30,000 Pa. For example, a supply flow rate of the $SiCl_4$ gas adjusted by the MFC 332 is set to be a predetermined flow rate within a range from 1 slm to 10 slm, preferably from 3 slm to 8 slm. For example, a time duration (which is a $SiCl_4$ gas supply time) of supplying the $SiCl_4$ gas into the process chamber 201 is set to be a predetermined time within a range from 60 seconds to 600 seconds.

<Third Residual Gas Removing Step>

After the $SiCl_4$ gas is supplied into the process chamber 201 for a predetermined time, the valve 334 is closed to stop the supply of the $SiCl_4$ gas. The APC valve 243 is closed or substantially closed to the extent that the etching process is not affected in the etching step, the APC valve 243 is opened. In the third residual gas removing step, with the APC valve 243 open, the vacuum pump 246 vacuum-exhausts the inner atmosphere of the process chamber 201 to remove a residual gas such as a residual $SiCl_4$ gas in the process chamber 201 which did not react or which contributed to the removal of the AlO layer from the process chamber 201 in the same manner as in the first residual gas removing step.

<Surface Oxidation Step>

The valve 324 is opened to supply the $O_3$ gas into the gas supply pipe 320. After a flow rate of the $O_3$ gas is adjusted by the MFC 322, the $O_3$ gas whose flow rate is adjusted is supplied into the process chamber 201 through the gas supply ports 420*a* of the nozzle 420, and is exhausted through the exhaust pipe 231. Simultaneously, the valve 524 is opened to supply the inert gas such as the $N_2$ gas into the gas supply pipe 520. After the flow rate of the $N_2$ gas serving as the inert gas is adjusted by the MFC 522, the $N_2$ gas whose flow rate is adjusted is supplied with the $O_3$ gas into the process chamber 201, and is exhausted through the exhaust pipe 231. In the surface oxidation step, in order to prevent the $O_3$ gas from entering the nozzles 410 and 430, the valves 514 and 534 are opened to supply the $N_2$ gas into the gas supply pipes 510 and 530. The $N_2$ gas is supplied into the process chamber 201 through the gas supply pipes 310 and 330 and the nozzles 410 and 430, and is exhausted through the exhaust pipe 231.

When the $O_3$ gas is supplied in the surface oxidation step, for example, the APC valve 243 is appropriately adjusted such that the inner pressure of the process chamber 201 is set to be a predetermined pressure within a range from 50 Pa to 1,330 Pa. For example, a supply flow rate of the $O_3$ gas) adjusted by the MFC 322 is set to be a predetermined flow rate within a range from 5 slm to 40 slm. For example, a time duration (which is a gas supply time) of supplying the $O_3$ gas is set to be a predetermined time within a range from 10 seconds to 600 seconds. In the surface oxidation step, for example, the temperature of the heater 207 is set to be the same as that of the source gas supply step.

By supplying the $O_3$ gas, locations such as an inner wall of the process chamber 201 and a surface of the boat 217 are oxidized (treated by an oxidation process). In addition, the by-products generated in the etching step may be reoxidized. For example, an Al—Cl bond of $AlCl_x$ included in the by-products is cut, chlorine (Cl) is removed as $Cl_2$, and the $AlCl_x$ is reoxidized to aluminum oxide (AlO). In addition, organic substances remaining in the AlO film reacts with the $O_3$ gas and is removed from the process chamber 201. For example, carbon (C) remaining in the AlO film reacts with the $O_3$ gas to form $CO_x$, which is removed from the process chamber 201. After the carbon is removed, a carbon defect is present on an outermost surface of the film (AlO film), and there is a weak bond equilibrium state of Al—O and Al—Al. The state described above is considered to be a surface equilibrium state suitable for etching.

<Fourth Residual Gas Removing Step>

After the $O_3$ gas is supplied into the process chamber 201 for a predetermined time, the valve 324 is closed to stop the supply of the $O_3$ gas. In the fourth residual gas removing step, with the APC valve 243 open, the vacuum pump 246 vacuum-exhausts the inner atmosphere of the process chamber 201 to remove a residual gas such as a residual $O_3$ gas in the process chamber 201 which did not react or which contributed to the reaction with the AlO layer from the process chamber 201 in the same manner as in the first residual gas removing step.

<Performing Predetermined Number of Times>

By performing the cycle wherein the source gas supply step, the etching step, the third residual gas removing step, the surface oxidation step and the fourth residual gas removing step are sequentially performed in order one or more time (m times), the AlO film adhered to the inside of the process chamber 201 is removed. It is preferable that the cycle described above is repeatedly performed a plurality of times.

As described above, it is preferable that the etching process (cleaning process) is performed by repeatedly performing the cycle including the etching step by the cleaning gas and the surface oxidation step by the $O_3$ gas a plurality of times. Since the vaporization is started and stopped in each cycle, the temperature (liquid temperature) of the liquid source is likely to fluctuate frequently. Therefore, the temperature control of the present embodiments whose temperature recovery rate is high is more preferable.

According to the present embodiments, it is possible to provide one or more of the following effects.

(a) By providing the internal heater 610 controlled based on the temperature (liquid temperature) of the liquid source and the external heater 620 controlled based on the temperature of the liquid vessel 600, when the liquid temperature fluctuates due to the occurrence of the vaporization, it is possible to shorten a recovery time until the liquid temperature is stabilized within a predetermined temperature or a predetermined temperature range.

(b) According to the present embodiments, the internal heater 610 is controlled such that the temperature measured by the first temperature sensor 630 becomes the predetermined first temperature, and the external heater 620 is controlled such that the temperature measured by the second temperature sensor 640 becomes the predetermined second temperature. The second temperature is set to a predetermined value corresponding to the first temperature in advance. As a result, it is possible to more stably control the liquid temperature as compared with a case where the first temperature and the second temperature are set to the same value.

<Modified Example>

Figure 8:
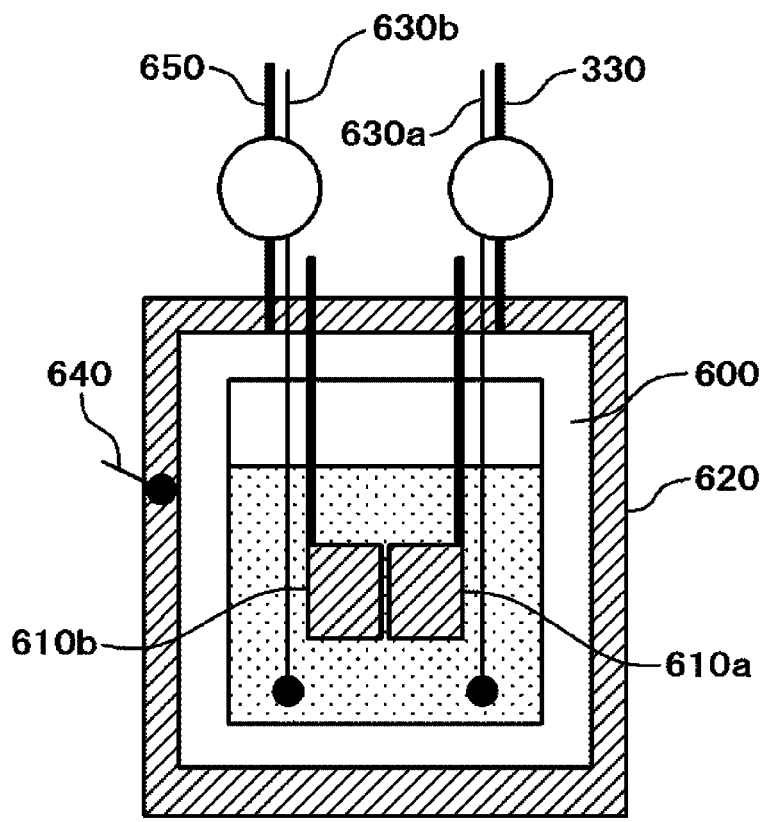
FIG. 8 schematically illustrates a configuration of a vaporizer according to a modified example of the embodiments described herein.

A vaporizer of the modified example will be described with reference to FIG. 8.

According to the modified example, in the liquid vessel 600 are provided the internal heater 610 serving as the first heater (which is the first heating apparatus) capable of heating the liquid source by immersion into the liquid source, the first temperature sensor 630 capable of measuring the temperature of the liquid source by immersion into the liquid source so as to control the internal heater 610 and the second temperature sensor 640 capable of measuring the temperature of the outer wall of the liquid vessel 600 to control the external heater 620. For example, the internal heater 610 is constituted by a first internal heater 610a and a second internal heater 610b, and the first temperature sensor 630 is constituted by a first internal sensor 630a and a second internal sensor 630b. However, the number of the internal heaters constituting the internal heater 610 and the number of the internal sensors constituting the first temperature sensor 630 are not limited thereto. For example, three or more internal heaters may constitute the internal heater 610, and three or more internal sensors may constitute the first temperature sensor 630. The first internal heater 610a is controlled independent of the second internal heater 610b such that the temperature measured by the first internal sensor 630a becomes the predetermined first temperature based on the temperature measured by the first internal sensor 630a. In addition, the second internal heater 610b is controlled independent of the first internal heater 610a such that the temperature measured by the second internal heater 610b becomes the predetermined first temperature based on the temperature measured by the second internal sensor 630b.

When the temperature measured by at least one among the first internal sensor 630a and the second internal sensor 630b exceeds a predetermined third temperature (upper limit temperature), the controller 121 stops the power supply to the first internal heater 610a and the second internal heater 610b. As a result, when an abnormal value exceeding the upper limit value is measured, it is possible to prevent an abnormal heating by stopping the heating by the internal heater 610. In addition, it is possible to ensure the temperature stability and the safety even when a sensor abnormality or a heater abnormality occurs.

Other Embodiments

While the technique is described in detail by way of the embodiments and the modified example, the technique of the present disclosure is not limited thereto. The technique of the present disclosure may be modified in various ways without departing from the gist thereof. For example, the above-described embodiments are described by way of an example in which the AlO film is used as a high dielectric constant oxide film to be etched. However, the technique of the present disclosure is not limited thereto. For example, the technique of the present disclosure may be similarly applied when a film other than the AlO film is used as the high dielectric constant oxide film. For example, as a high dielectric constant oxide, an oxide such as $ZrO_y$, $HfO_y$, $HfSi_xO_y$, $HfAl_xO_y$, $ZrSiO_y$, $ZrAlO_y$, $Ti_xO_y$ and $Ta_xO_y$ (wherein x and y are integers or decimals larger than 0) may be used. That is, the technique of the present disclosure may be similarly applied to an oxide film such as a zirconium oxide film, a hafnium oxide film, a titanium oxide film, a tantalum oxide film and a composite film thereof.

For example, the above-described embodiments are described by way of an example in which the TMA is used as the organic-based source material. However, the technique of the present disclosure is not limited thereto. For example, the technique of the present disclosure may be similarly applied when a source material (which is an organic compound) other than the TMA is used as the organic-based source material. For example, the technique of the present disclosure may be similarly applied to a source material such as an organic hafnium (Hf) source material such as tetrakis(ethylmethylamino)hafnium ($Hf[N(CH_3)CH_2CH_3]_4$, abbreviated as TEMAH), an organic silicon (Si) source material such as tris(dimethylamino)silane ($SiH[N(CH_3)_2]_3$, abbreviated as TDMAS), an organic titanium (Ti) source material such as tetrakis(dimethylamino)titanium ($Ti[N(CH_3)_2]_4$, abbreviated as TDMAT) and an organic silicon tantalum (Ta) source material such as pentakis(dimethylamino)tantalum ($Ta[N(CH_3)_2]_5$, abbreviated as PDMAT).

For example, the above-described embodiments are described by way of an example in which the $O_3$ gas is used in the film-forming process. However, the technique of the present disclosure is not limited thereto. For example, the technique of the present disclosure may be similarly applied when an oxygen-containing gas is used in the film-forming process instead of the $O_3$ gas. For example, the technique of the present disclosure may be similarly applied when a gas such as oxygen gas ($O_2$ gas), oxygen plasma ($O_2$ plasma), water vapor ($H_2O$), hydrogen peroxide gas ($H_2O_2$ gas) and nitrous oxide gas ($N_2O$ gas) is used in the film-forming process.

For example, the above-described embodiments are described by way of an example in which the liquid source of the cleaning gas is stored in the liquid vessel 600 and vaporized by the vapor draw method without using the carrier gas. However, the technique of the present disclosure is not limited thereto. For example, the technique of the present disclosure may be similarly applied when the liquid source of the cleaning gas is vaporized by a bubbling method using the carrier gas.

For example, the above-described embodiments are described by way of an example in which the $O_3$ gas serving as the oxidizing gas is used in the surface oxidation step. However, the technique of the present disclosure is not limited thereto. For example, the technique of the present disclosure may be similarly applied when an oxygen-containing gas reacting with a halogen element contained in the etching gas is used in the surface oxidation step instead of the $O_3$ gas. For example, the technique of the present disclosure may be similarly applied when a gas such as the water vapor ($H_2O$) and the hydrogen peroxide gas ($H_2O_2$ gas) is used in the surface oxidation step.

It is preferable that the process recipe (or a cleaning recipe) (that is, a program defining parameters such as the process sequences and the processing conditions of the substrate processing) used to form the above-described various films is prepared individually according to the contents of the substrate processing or the cleaning process such as a type of the film to be formed, a composition ratio of the film, a quality of the film, a thickness of the film, the process sequences and the processing conditions of the substrate processing. That is, a plurality of process recipes (and a plurality of cleaning recipes) are prepared in advance. When starting the substrate processing (or the cleaning process), an appropriate process recipe (or an appropriate cleaning recipe) is preferably selected among the plurality of the process recipes (or the plurality of the cleaning recipes) according to the contents of the substrate processing (or the cleaning process). Specifically, it is preferable that the plurality of the process recipes (and the plurality of the cleaning recipes) are stored (installed) in the memory 121c of the substrate processing apparatus in advance via an electric communication line or the recording medium (for example, the external memory 123) storing the plurality of the process recipes (and the plurality of the cleaning recipes). Then, when starting the substrate processing (or the cleaning process), the CPU 121a preferably selects the appropriate process recipe (or the appropriate cleaning recipe) among the plurality of the process recipes (or the plurality of the cleaning recipes) stored in the memory 121c of the substrate processing apparatus according to the contents of the substrate processing (or the cleaning process). Thereby, various films of different types, composition ratios, different qualities and different thicknesses may be formed at the high reproducibility using a single substrate processing apparatus. In addition, since the burden on the operator such as inputting the process sequences and the processing conditions may be reduced, various processes of the substrate processing can be performed quickly while avoiding an operation mistake.

The technique of the present disclosure may be implemented by changing an existing process recipe (or an existing cleaning recipe) stored in the substrate processing apparatus to a new process recipe (or a new cleaning recipe). When changing the existing process recipe (or the existing cleaning recipe) to the new process recipe (or the new cleaning recipe), the new process recipe (or the new cleaning recipe) may be installed in the substrate processing apparatus via the electric communication line or the recording medium storing the plurality of the process recipes (or the plurality of the cleaning recipes). The existing process recipe (or the existing cleaning recipe) already stored in the substrate processing apparatus may also be directly changed to the new process recipe (or the new cleaning recipe) according to the technique of the present disclosure by operating the input/output device of the substrate processing apparatus.

As described above, according to some embodiments in the present disclosure, it is possible to stabilize the supply flow rate of the vaporized gas.

What is claimed is:

1. A vaporizer comprising:
  a liquid vessel in which a liquid source is stored;
  a first heater immersed into the liquid source stored in the liquid vessel for heating the liquid source;
  a second heater capable of heating the liquid vessel;
  a first temperature sensor capable of measuring a temperature of the liquid source by immersion into the liquid source;
  a second temperature sensor capable of measuring a temperature of the liquid vessel; and
  a controller capable of controlling the first heater based on the temperature measured by the first temperature sensor and controlling the second heater based on the temperature measured by the second temperature sensor.

2. The vaporizer of claim 1, wherein the controller is capable of controlling the first heater such that the temperature measured by the first temperature sensor reaches and is maintained at a predetermined first temperature and controlling the second heater such that the temperature measured by the second temperature sensor reaches and is maintained at a predetermined second temperature.

3. The vaporizer of claim 2, wherein the second temperature is set to a predetermined value corresponding to the first temperature in advance.

4. The vaporizer of claim 2, wherein the second temperature is set to a temperature higher than the first temperature.

5. The vaporizer of claim 3, wherein the second temperature is set to a temperature higher than the first temperature.

6. The vaporizer of claim 2, wherein the first temperature and the second temperature are set such that a relationship of Q/A>2.0% is satisfied where A denotes a cross-sectional area (in unit of $cm^2$) of the liquid vessel and Q denotes a flow rate (in unit of slm) of a gas generated by vaporizing the liquid source.

7. The vaporizer of claim 1, wherein the first heater is constituted by at least a first internal heater and a second internal heater, and the first temperature sensor is constituted by at least a first internal sensor and a second internal sensor.

8. The vaporizer of claim 7, wherein the controller is configured to control the first internal heater based on a temperature measured by the first internal sensor and to control the second internal heater based on a temperature measured by the second internal sensor.

9. The vaporizer of claim 7, wherein the controller is configured to control the first internal heater and the second internal heater such that a temperature measured by the first internal sensor and a temperature measured by the second internal heater reach and are maintained at a predetermined first temperature.

10. The vaporizer of claim 8, wherein the controller is configured to control the first internal heater and the second internal heater such that the temperature measured by the first internal sensor and the temperature measured by the second internal heater reach and are maintained at a predetermined first temperature.

11. The vaporizer of claim 7, wherein the controller is configured to stop a power supply to the first internal heater and the second internal heater when a temperature measured by at least one among the first internal sensor and the second internal sensor exceeds a predetermined third temperature.

12. The vaporizer of claim 8, wherein the controller is configured to stop a power supply to the first internal heater and the second internal heater when the temperature measured by at least one among the first internal sensor and the second internal sensor exceeds a predetermined third temperature.

13. The vaporizer of claim 1, wherein the liquid source comprises a source material from which a cleaning gas is made.

14. A substrate processing apparatus comprising:
a process chamber in which a substrate is processed;
a vaporizer comprising:
a liquid vessel in which a liquid source is stored;
a first heater immersed into the liquid source stored in the liquid vessel for heating the liquid source;
a second heater capable of heating the liquid vessel;
a first temperature sensor capable of measuring a temperature of the liquid source by immersion into the liquid source; and
a second temperature sensor capable of measuring a temperature of the liquid vessel;
a gas supplier capable of supplying a gas obtained by vaporizing the liquid source by the vaporizer into the process chamber; and
a controller capable of controlling the first heater based on the temperature measured by the first temperature sensor and controlling the second heater based on the temperature measured by the second temperature sensor.

15. The substrate processing apparatus of claim 14, wherein the controller is capable of controlling the gas supplier to perform a cycle a plurality of times, the cycle comprising supplying and stopping the gas obtained by vaporizing the liquid source by the vaporizer.

* * * * *